US012713558B2

(12) United States Patent
Schulz et al.

(10) Patent No.: US 12,713,558 B2
(45) Date of Patent: Aug. 18, 2026

(54) TEMPERATURE-CONTROL ARRANGEMENT FOR A MICROELECTRIC SYSTEM

(71) Applicant: Robert Bosch GmbH, Stuttgart (DE)

(72) Inventors: Udo Schulz, Vaihingen/Enz (DE); Hubert Straub, Tuebingen (DE); Markus Ketterer, Stuttgart (DE); Martin Astner, Pleidelsheim (DE); Rico Alf Klein, Flein (DE); Vaclav Kocourek, Beilstein (DE)

(73) Assignee: Robert Bosch GmbH, Stuttgart (DE)

( * ) Notice: Subject to any disclaimer, the term of this patent is extended or adjusted under 35 U.S.C. 154(b) by 253 days.

(21) Appl. No.: 18/691,277

(22) PCT Filed: Sep. 19, 2022

(86) PCT No.: PCT/EP2022/075954
§ 371 (c)(1),
(2) Date: Mar. 12, 2024

(87) PCT Pub. No.: WO2023/046629
PCT Pub. Date: Mar. 30, 2023

(65) Prior Publication Data

US 2024/0375941 A1 Nov. 14, 2024

(30) Foreign Application Priority Data

Sep. 23, 2021 (DE) .................... 10 2021 210 606.4

(51) Int. Cl.
*H05K 7/20* (2006.01)
*B81B 7/00* (2006.01)
(Continued)

(52) U.S. Cl.
CPC ....... *H05K 7/20272* (2013.01); *B81B 7/0087* (2013.01); *F04B 19/006* (2013.01);
(Continued)

(58) Field of Classification Search
CPC .............. H05K 7/20272; B81B 7/0087; H02K 44/08–14; H02K 9/19; F04B 19/06;
(Continued)

(56) References Cited

U.S. PATENT DOCUMENTS 6,658,861 B1 12/2003 Ghoshal et al.
7,171,853 B1 * 2/2007 Laughlin .............. G01P 15/006 73/504.07
(Continued)

FOREIGN PATENT DOCUMENTS

DE 102017214173 A1 2/2019
JP S63310362 A 12/1988
(Continued)

OTHER PUBLICATIONS

First Refusal for JP2024-518444 (Aug. 12, 2025).*
(Continued)

*Primary Examiner* — Zachary Pape
(74) *Attorney, Agent, or Firm* — Norton Rose Fulbright US LLP

(57) ABSTRACT

A temperature-control arrangement for a microelectric system, and a microelectric system. The temperature-control arrangement includes a closed channel system, which includes at least one channel for guiding an electrically and thermally conductive medium and is thermally coupled to at least one object to be temperature-controlled of the microelectric system, and a magnetohydrodynamic pump with a plurality of magnetohydrodynamic modules, which each include an electrode device with two electrodes and a magnet device, which generates a magnetic field, wherein at least two magnetohydrodynamic modules are designed as pump modules and are electrically connected in series.

17 Claims, 5 Drawing Sheets

(51) Int. Cl.

| | |
|---|---|
| ***F04B 19/00*** | (2006.01) |
| ***F04B 23/04*** | (2006.01) |
| ***F04B 53/08*** | (2006.01) |
| ***H02K 9/19*** | (2006.01) |
| ***H02K 44/08*** | (2006.01) |
| ***H10W 40/47*** | (2026.01) |

(52) U.S. Cl.
CPC ............... *F04B 23/04* (2013.01); *F04B 53/08* (2013.01); *H02K 9/19* (2013.01); *H02K 44/085* (2013.01); *H10W 40/47* (2026.01)

(58) Field of Classification Search
CPC ........ F04B 23/04; F04B 53/08; H10W 40/47; H01L 23/473
See application file for complete search history.

(56) References Cited

U.S. PATENT DOCUMENTS 7,672,129 B1 * 3/2010 Ouyang ................ H01L 23/473 174/15.1
8,480,377 B2 * 7/2013 Ciocanel ................ H02K 41/03 204/600
9,693,480 B2 * 6/2017 Salat ..................... H01L 23/473
2006/0045755 A1 3/2006 McDonald et al.
2006/0185973 A1 8/2006 Yazawa et al.
2011/0037325 A1 2/2011 Ciocanel et al.
2012/0273164 A1 11/2012 Vetrovec
2015/0289410 A1 10/2015 Salat et al.
2017/0325359 A1 11/2017 Lazarus et al.
2021/0257278 A1 8/2021 Song et al.

FOREIGN PATENT DOCUMENTS

JP H448662 A 2/1992
JP H9138717 A 5/1997
WO 03077277 A1 9/2003

OTHER PUBLICATIONS

Second Refusal for JP2024-518444 (Feb. 17, 2025).*
Translation of the Written Opinion for PCT/EP2022/075954 (Mar. 26, 2024).*
International Search Report for PCT/EP2022/075954, Issued Nov. 30, 2022.

* cited by examiner

TEMPERATURE-CONTROL ARRANGEMENT FOR A MICROELECTRIC SYSTEM

FIELD

The present invention relates to a temperature-control arrangement for a microelectric system. The present invention is also related to a microelectric system with such a temperature-control arrangement.

BACKGROUND INFORMATION

Magnetohydrodynamics (MHD) is a subfield of physics. It describes the behavior of electrically conducting fluids penetrated by magnetic and electric fields. Magnetohydrodynamics in the narrower sense deals with liquids, in particular also plasmas, which are described as fluids in the context of MHD. Typical areas of application of magnetohydrodynamics are flow control and flow measurement in metallurgy and semiconductor single-crystal growth. For example, magnetic fields can be used in metallurgy to influence the flow of liquid metals, such as steel or aluminum. In application, a distinction must be made between static and time-dependent magnetic fields. Static, i.e., time-independent, magnetic fields lead to damping of turbulence and are therefore used, for example in the form of magnetic brakes, in the continuous casting of steel. Time-dependent magnetic fields are, for example, used for electromagnetic support in the casting of aluminum.

SUMMARY

A temperature-control arrangement for a microelectric system with the features of the present invention and a microelectric system with features of the present invention may each have the advantage that scalable temperature control (cooling or heating) is made possible for objects to be temperature-controlled of microelectronic systems without disturbing the objects to be temperature-controlled by undesired electrical or electromagnetic effects.

The present invention includes a magnetohydrodynamic pump with two pump modules, which are electrically connected in series to convey suitable electrically and thermally conducting media for temperature control, i.e., for cooling and heating the objects to be temperature-controlled, such electronic components, semiconductor components, control devices, etc. Through the electrical series connection of a plurality of pump modules, the required electric current can be significantly reduced in comparison to only one pump module at the same voltage according to the number of electrically series-connected pump modules. As a result, the electrical and electromagnetic interferences of the objects to be temperature-controlled can be reduced and the pump modules can be designed to be smaller. In comparison to conventional systems with a pump module, the series connection of at least two pump modules also reduces the electrical losses in the electrically and thermally conductive medium and in an electrical supply line of the magnetohydrodynamic pump, which also increases efficiency. Depending on the structure of an associated closed channel system, corresponding channels of the channel system or regions of the object to be temperature-controlled can also be temperature-controlled individually as needed, whereby uniform cooling or heating and an even temperature distribution on the object to be temperature-controlled can be realized. This results in less mechanical stress and fewer heat flows. Since the individual pump modules can be designed to be very small, any channel structures, for example up to the silicon level, can be individually controlled with respect to the temperature in the at least one channel by means of associated pump modules so that corresponding semiconductor structures can be optimally temperature-controlled. The temperature control or cooling of other electronic components, such as electrolytic capacitors, can be optimally cooled with embodiments of the temperature-control arrangement according to the present invention. As a result, the service life of electrolytic capacitors can be significantly improved, and available capacitances and thus installation space and vibration strength problems in the corresponding microelectric system can thus be reduced.

Example embodiments of the present invention provide a temperature-control arrangement for a microelectric system, with a closed channel system, which comprises at least one channel for guiding an electrically and thermally conductive medium and is thermally coupled to at least one object to be temperature-controlled of the microelectric system, and a magnetohydrodynamic pump with a plurality of magnetohydrodynamic modules, which each comprise an electrode device with two electrodes and a magnet device, which generates a magnetic field. In this case, at least two magnetohydrodynamic modules are designed as pump modules and electrically connected in series. In each of the pump modules, a first electrode of the electrode device introduces an electric current flow with a specified current density at at least one channel portion into the electrically and thermally conductive medium and a second electrode of the electrode device conducts the electric current flow at the at least one channel portion out of the electrically and thermally conductive medium so that cooperation of the electrically and thermally conductive medium, guided in the closed channel system, with the introduced electric current flow and with the generated magnetic field generates a Lorentz force, which in a targeted manner accelerates the electrically and thermally conductive medium in the at least one channel portion, and a resulting pressure build-up brings about a desired volume flow of the electrically and thermally conductive medium through the at least one channel of the closed channel system. The volume flow of the electrically and thermally conductive medium brings about a temperature control of the at least one object to be temperature-controlled, wherein the electrically and thermally conductive medium transfers heat to the at least one object to be temperature-controlled during a heating process or absorbs heat from the at least one object to be temperature-controlled during a cooling process.

Also provided according to an example embodiment of the present invention is a microelectric system with at least one object to be temperature-controlled and at least one such temperature-control arrangement for controlling the temperature of the at least one object to be temperature-controlled.

In comparison to the related art, embodiments of the temperature-control arrangement according to the present invention make significantly more powerful and more efficient microelectric systems possible, for example through individual and/or dynamic and/or continuous and/or targeted and/or uniform cooling of individual electronic or electrical components to be cooled of the microelectric system. If necessary, individual and/or dynamic and/or continuous and/or targeted and/or uniform heating of the individual electronic or electrical components of the microelectric system is also possible.

The use of a plurality of pump modules in the magnetohydrodynamic pump also makes a smaller structural design of the individual pump modules possible. As a result of this compact design of the individual pump modules and the use of a plurality of pump modules, the existing installation space can be utilized variably and better than when only one large pump module is used. Furthermore, the lack of mechanically moving parts results in low mechanical wear and good noise behavior of the magnetohydrodynamic pump.

An/The electrically and thermally conductive medium is hereinafter understood to mean a medium with an electrical conductivity that is greater than 1 S/m (Siemens per meter). Preferably, the electrically and thermally conductive medium has a significantly greater electrical conductivity (100 to 1000 S/m). The electrically and thermally conductive medium used can, for example, be an electrically and thermally conductive liquid, an electrically and thermally conductive gas, an ionic liquid, at least one electrolyte, at least one plasma, at least one liquid metal, such as gallium, lithium, sodium or mercury, and/or at least one liquid metal alloy, such as a sodium-potassium alloy. Preferably, a non-toxic liquid metal alloy of gallium, indium and tin can be used as an electrically and thermally conductive medium. This alloy is already liquid at atmospheric pressure from a temperature of −20° C. and can simply be heated from a lower temperature to a temperature of −20° C. or higher. The examples described here of the electrically and thermally conductive medium are however not to be regarded as exhaustive.

Through the measures and developments of the present invention disclosed herein, advantageous improvements to the temperature-control arrangement for a microelectric system and the microelectric system are possible.

According to an example embodiment of the present invention, it is particularly advantageous that the closed channel system can be thermally coupled to at least one heat exchanger, which can be designed as a heating element for the heating process or as a cooling element for the cooling process. This means that the heat exchanger thermally coupled to the channel system supplies heat to the electrically and thermally conductive medium during a heating process and absorbs heat from the electrically and thermally conductive medium during a cooling process.

In a further advantageous embodiment of the temperature-control arrangement of the present invention, the closed channel system can be at least partially arranged in a thermally conducting base body, which is thermally coupled to the at least one object to be temperature-controlled. This means that, in a cooling operation, the base body can act as a cooling element, which transfers heat from the object to be temperature-controlled into the electrically and thermally conductive medium, and, in a heating process, can act as a heating element, which extracts heat from the electrically and thermally conductive medium and transfers it to the object to be temperature-controlled. The base body may also fully accommodate the closed channel system and the magnetohydrodynamic pump. This makes a particularly compact embodiment of the temperature-control arrangement possible. In this case, the base body can be thermally coupled to a top side or a bottom side of the at least one object to be temperature-controlled, for example directly or by way of a thermally conductive interface material. Alternatively, a circuit board or a circuit carrier can be arranged between the base body and the object to be temperature-controlled so that the base body can be thermally coupled by way of at least one thermally conductive through-connection to a top side or a bottom side of the at least one object to be temperature-controlled.

In a further advantageous embodiment of the temperature-control arrangement of the present invention, the at least one channel can be surrounded by an electrical insulation at least within the base body. As a result, an undesired short circuit between the electrically and thermally conductive medium and the base body can be prevented since a partial current can flow through the electrically and thermally conductive medium in an electric series connection of the pump modules of the magnetohydrodynamic pump.

In a further advantageous embodiment of the temperature-control arrangement of the present invention, at least one magnetohydrodynamic module can be designed as a sensor module, in which, at the at least one channel portion, the electrodes of the electrode device can tap an induction voltage, which results from the volume flow of the electrically and thermally conductive medium in cooperation with the generated magnetic field of the magnet device and from which a flow velocity of the electrically and thermally conductive medium can be ascertained. Since the induced voltage is proportional to the flow rate, a control of the flow rate is also possible in order to be able to optimally cool or heat the object to be temperature-controlled. By measuring the temperature of the electrically and thermally conductive medium taking advantage of the temperature dependence of the electrical conductivity of the electrically and thermally conductive medium, dynamic and targeted temperature control is possible. In this case, for measuring the temperature, the magnetohydrodynamic pump can be switched off for a short time in order to ascertain the conductivity of the electrically and thermally conductive medium, for example by way of a measurement bridge. In this case, in addition to the at least two pump modules, a magnetohydrodynamic module can be used as a sensor module. Alternatively, at least one magnetohydrodynamic module can be designed to be switchable and can be operated in a first operating mode as a pump module and in a second operating mode as a sensor module. In this case, the first operating mode can correspond to a pumping operation and the second operating mode can correspond to a measuring operation. As a result, one magnetohydrodynamic module can be saved. The measurement of the flow velocity can in this case be used to determine whether the magnetohydrodynamic pump is switched off and the electrically and thermally conductive medium no longer moves. Instead of the conductivity measurement, explicit temperature sensors at inlets or outlets of the channels or distributed on the surface of the base body can also be used to control the pump modules individually or as required. In addition, temperature sensors in the object to be temperature-controlled can also be used. The measurement of the flow velocity and/or of the temperature of the electrically and thermally conductive medium results in good controllability of individual channels through a direct principle of action. Efficient pumping of the electrically and thermally conductive medium through the channel structures of the closed channel system is also possible.

In a further advantageous embodiment of the temperature-control arrangement of the present invention, the at least two pump modules can be arranged fluidically in series one behind the other in a common channel. Such an electrical and fluidic series connection increases electrical efficiency and reduces EMC problems. In this case, the one series connection of the at least two pump modules generates a pressure in the electrically and thermally conductive medium of the corresponding channel, which pressure increases with each pump module and drives the volume flow through the at least one channel of the closed channel system. The at least two pump modules arranged fluidically in series can, for example, be arranged one behind the other upstream or downstream of the at least one object to be temperature-controlled. Through the adjacent arrangement of the at least two pump modules, a partial current can flow through the electrically and thermally conductive medium. At temperatures below the lowest specified temperature, this partial current can be used to heat the electrically and thermally conductive medium in the channel system. Alternatively, the at least two pump modules arranged fluidically in series can be arranged separately from one another. In this case, at least one first pump module can be arranged upstream and at least one second pump module can be arranged downstream of the at least one object to be temperature-controlled. As a result of this arrangement, the at least one first pump module upstream of the object to be temperature-controlled can be designed only such that the pressure is sufficient to drive a sufficient volume flow through the channel system in the region of the object to be temperature-controlled. The at least one second pump module downstream of the object to be temperature-controlled can then be designed such that it can drive a sufficient volume flow through the rest of the channel system. To a limited extent, the at least one second pump module can also draw. It is advantageous in this arrangement that no unnecessary pressure load of the closed channel system occurs in the region of the object to be temperature-controlled, and thus no mechanical stress of the object to be temperature-controlled. This makes a thinner design of the walls of the closed channel system possible. A pendulum cooling is also possible, which means that the electrically and thermally conductive medium can be moved at times in the one direction and at times in the other direction as a result of a current direction reversal in the magnetohydrodynamic pump.

In a further advantageous embodiment of the temperature-control arrangement of the present invention, the at least two pump modules can be arranged fluidically in parallel in at least two parallel channels. This makes a targeted control of individual channels of the closed channel system possible. In this case, at least two magnetohydrodynamic modules arranged fluidically in series one behind the other can be arranged in at least one of the at least two parallel channels. Through this fluidic parallel connection of the at least two pump modules, the entire volume flow in the closed channel system can be increased without further increasing the pressure. In conjunction with the temperature measurement described above, an individual volume flow in the individual parallel channels can be realized in order, for example, to avoid hot spots on the object to be temperature-controlled, or to cool in a very targeted manner high-loss regions of the object to be temperature-controlled, or to ensure a uniform temperature or a targeted temperature distribution. Also possible would be a spatially higher resolution of the temperature detection by local temperature measurements, for example by two successive electrodes each on one side of the respective channel portion, which can either be integrated in the pump modules or separately mounted along the channel portion. Furthermore, the temperature can also be detected by two opposing electrodes of a pair of electrodes. In order to avoid a possible influence of the moving, electrically and thermally conductive medium on the measurement, it may be useful to stop the pump modules for the time of measurement.

In a further advantageous embodiment of the temperature-control arrangement of the present invention, the at least one magnet device can comprise at least two permanent magnets or at least one electrical coil device. By using at least two permanent magnets, a static magnetic field can simply be provided. A time-varying magnetic field can be provided by the at least one coil device.

In an advantageous embodiment of the microelectric system of the present invention, the at least one temperature-control arrangement and the at least one object to be temperature-controlled can be surrounded by a common casing. This makes a particularly compact design possible.

Exemplary embodiments of the present invention are shown in the figures and explained in more detail in the following description. In the figures, identical reference signs refer to components or elements performing identical or similar functions.

DETAILED DESCRIPTION OF EXAMPLE EMBODIMENTS

Figure 1:
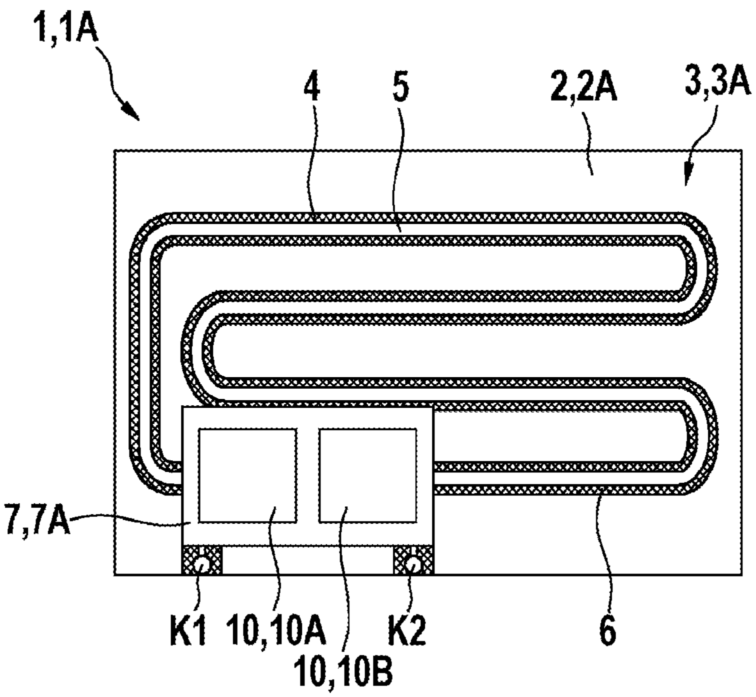
FIG. 1 shows a schematic representation of a first exemplary embodiment of a temperature-control arrangement according to the present invention for a microelectric system.

As can be seen in FIGS. 1 to 9, the exemplary embodiments shown of a temperature-control arrangement 1, 1A, 1B, 1C, 1D according to the present invention for a microelectric system 20, 20A, 20B, 20C, 20D each comprise a closed channel system 3, 3A, 3B, 3C, 3D, which comprises at least one channel 4 for guiding an electrically and thermally conductive medium 5 and is thermally coupled to at least one object 9 to be temperature-controlled of the microelectric system 20, 20A, 20B, 20C, 20D, and a magnetohydrodynamic pump 7, 7A, 7B, 7C with a plurality of magnetohydrodynamic modules 10, which each comprise an electrode device 12 with two electrodes 12A, 12B and a magnet device 14, which generates a magnetic field B. In this case, at least two magnetohydrodynamic modules 10 are designed as pump modules 10A, 10B and electrically connected in series. In each of the pump modules 10A, 10B, a first electrode 12A of the electrode device 12 introduces an electric current flow I with a specified current density j at at least one channel portion 4A, 4B into the electrically and thermally conductive medium 5 and a second electrode 12B of the electrode device 12 conducts the electric current flow I at the at least one channel portion 4A, 4B out of the electrically and thermally conductive medium 5 so that cooperation of the electrically and thermally conductive medium 5, guided in the closed channel system 3, 3A, 3B, 3C, 3D, with the introduced electric current flow I and with the generated magnetic field B generates a Lorentz force FL, which in a targeted manner accelerates the electrically and thermally conductive medium 5 in the at least one channel portion 4A, 4B, and a resulting pressure build-up brings about a desired volume flow of the electrically and thermally conductive medium 5 through the at least one channel 4 of the closed channel system 3, 3A, 3B, 3C, 3D. The volume flow of the electrically and thermally conductive medium 5 brings about a temperature control of the at least one object 9 to be temperature-controlled, wherein the electrically and thermally conductive medium 5 transfers heat to the at least one object 9 to be temperature-controlled during a heating process or absorbs heat from the at least one object 9 to be temperature-controlled during a cooling process.

Figure 2:
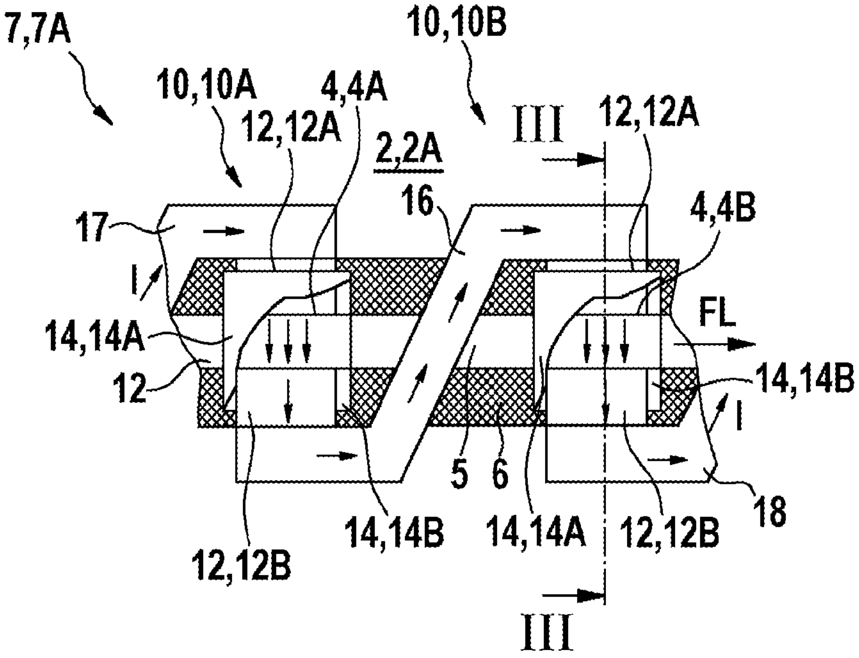
FIG. 2 shows a schematic representation of an exemplary embodiment of a magnetohydrodynamic pump 7 of the temperature-control arrangement according to the present invention of FIG. 1.
Figure 3:
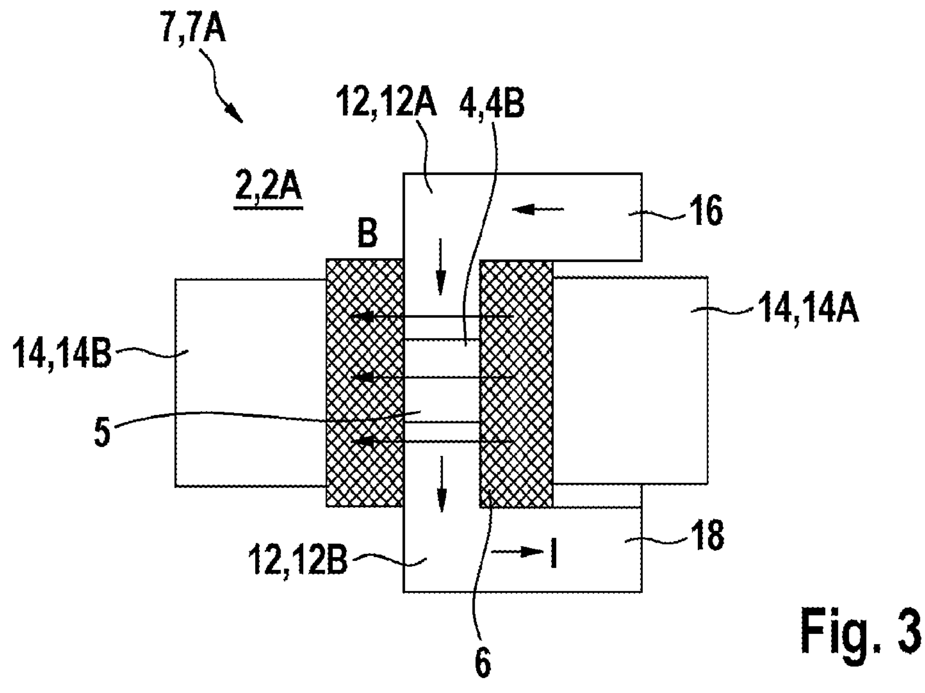
FIG. 3 shows a schematic sectional view along the cutting line III-III in FIG. 2.

As can further be seen in FIGS. 1 and 2, the first exemplary embodiment shown of the magnetohydrodynamic pump 7A comprises two electrically and fluidically series-connected pump modules 10A, 10B. In this case, a first electrical contact K1 of the magnetohydrodynamic pump 7A is electrically connected to the first electrode 12A of a first electrode device 12 of a first pump module 10A by way of a first connecting line 17. The second electrode 12B of the first electrode device 12 of the first pump module 10A is connected to the first electrode 12A of a second electrode device 12 of a second pump module 10B by way of a connection line 16. The second electrode 12B of the second electrode device 12 of the second pump module 10B is connected to a second electrical contact K2 of the magnetohydrodynamic pump 7A by way of a second connecting line 18. The two magnet devices 14 of the two pump modules 10A, 10B each comprise two permanent magnets 14A, 14B. In an alternative exemplary embodiment not shown, the at least one magnet device 14 comprises at least one electrical coil device. Of course, more than two pump modules 10A, 10B may also be connected in series. In this case, the series connection of pump modules 10A, 10B generates a pressure in the electrically and thermally conductive medium 5, which pressure increases with each pump module 10A, 10B and drives the volume flow of the electrically and thermally conductive medium 5 through the closed channel system 3, 3A, 3B, 3C, 3D.

As can further be seen in FIGS. 4 to 9, the exemplary embodiments shown of the microelectric system 20, 20A, 20B, 20C, 20D each comprise at least one object 9 to be temperature-controlled and at least one temperature-control arrangement 1, 1A, 1B, 1C, 1D for controlling the temperature of the at least one object 9 to be temperature-controlled. In the exemplary embodiments shown, only one object 9 to be temperature-controlled, which is designed as a semiconductor chip 9A, is shown in each case. Of course, the microelectric system 20, 20A, 20B, 20C, 20D may also comprise a plurality of and/or other objects 9 to be temperature-controlled, such as electronic and/or electrical components, semiconductor components, control devices, etc.

In the exemplary embodiments shown, the closed channel system 3, 3A, 3B, 3C, 3D is thermally coupled to at least one heat exchanger 8, which is designed as a heating element for the heating process or as a cooling element 8A for the cooling process. This means that, during a heating process, the at least one heat exchanger 8, which is designed as a heating element, transfers heat into the electrically and thermally conductive medium 5 in the closed channel system 3, 3A, 3B, 3C, 3D, which heat is transferred from the electrically and thermally conductive medium 5 to the at least one object 9 to be temperature-controlled. During a cooling process, the at least one heat exchanger 8, which is designed as a cooling element 8A, absorbs heat from the electrically and thermally conductive medium 5, which heat is transferred from the at least one object 9 to be temperature-controlled to the electrically and thermally conductive medium 5. In the exemplary embodiments shown, a non-toxic liquid metal alloy made of gallium, indium and tin is used as the electrically and thermally conductive medium 5 in each case. Of course, other suitable fluids may also be used as the electrically and thermally conductive medium 5.

As can further be seen in FIGS. 1 to 9, the closed channel system 3, 3A, 3B, 3C, 3D is arranged at least partially in a thermally conducting base body 2, 2A, 2B, 2C, 2D, which is thermally coupled to the at least one object 9 to be temperature-controlled. In this case, the at least one channel 4 of the closed channel system 3, 3A, 3B, 3C, 3D is surrounded by an electrical insulation 6 at least within the base body 2, 2A, 2B, 2C, 2D so that the at least one channel 4 is electrically insulated from the base body 2, 2A, 2B, 2C, 2D. Alternatively, the base body 2, 2A, 2B, 2C, 2D can be made of a thermally conductive but electrically insulating material, such as ceramic, and form the electrical insulation 6. Solutions with a mixed compound of electrically insulating materials and metal are also possible. This can in particular be necessary where high heat spreading is required for a thermal interface to a hot spot of the at least one object 9 to be temperature-controlled. This means that the electrical insulation can then also take place by way of a circuit carrier 24 or other insulation mechanisms.

In the first exemplary embodiment shown in FIGS. 1 to 6 of the temperature-control arrangement 1A, the base body 2A completely accommodates the closed channel system 3A and the magnetohydrodynamic pump 7. In this case, the two electrical contacts K1, K2 of the magnetohydrodynamic pump 7A are guided out of the base body 2A in order to supply the current I to the magnetohydrodynamic pump 7A. The two electrical contacts K1, K2 are adapted to the existing contact means of the corresponding microelectric system 20A, 20B, 20C, wherein various suitable contacting techniques can be used for contacting. In the first exemplary embodiment shown of the temperature-control arrangement 1A, the closed channel system 3A also comprises only a single channel 4, which is embedded in the shape of a meander in the base body 2A. Of course, the magnetohydrodynamic pump 7 may have even more than the two electrical contacts K1, K2 shown.

Figure 4:
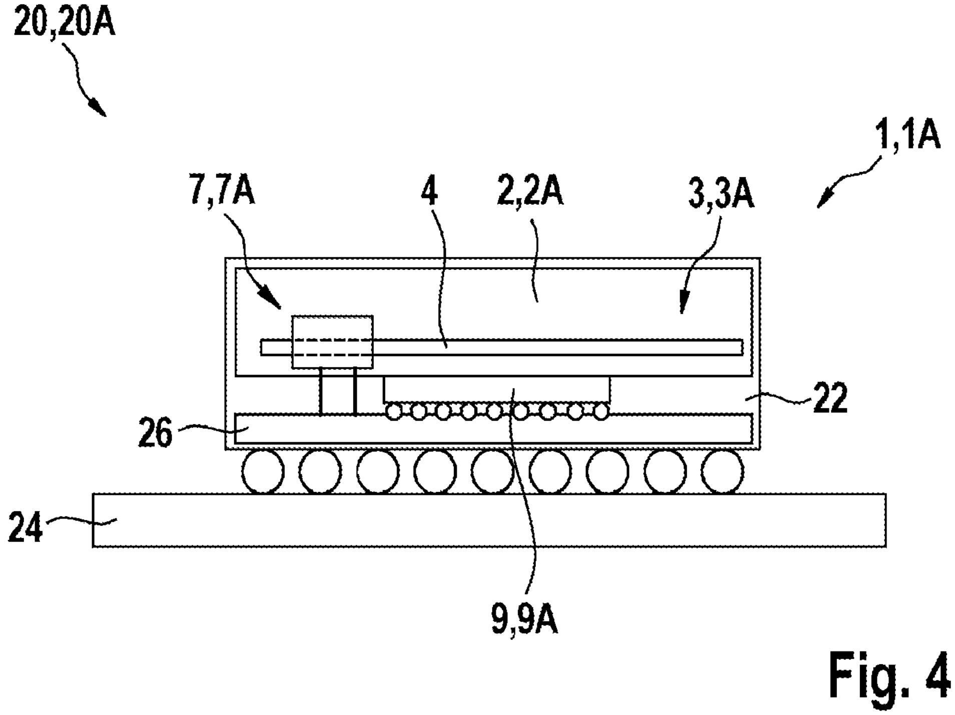
FIG. 4 shows a schematic representation of a first exemplary embodiment of a microelectric system with the temperature-control arrangement according to the present invention of FIGS. 1 to 3.

As can further be seen in FIG. 4, the base body 2A in the first exemplary embodiment shown of the microelectric system 20A is thermally coupled directly to a top side of the at least one object 9 to be temperature-controlled. In an exemplary embodiment not shown, in order to compensate for unevenness, a thermally conductive interface material can be introduced between the base body 2A and the top side of the at least one object 9 to be temperature-controlled. In the exemplary embodiment shown, the shown object 9 to be temperature-controlled, which is designed as a semiconductor chip 9A, is contacted at its bottom side with a circuit board 26, which in turn is contacted with a multilayer circuit carrier 24. In addition, the temperature-control arrangement 1A and the at least one object 9 to be temperature-controlled are surrounded by a common casing 22. In this case, the base body 2A can be arranged completely within the casing 22 as shown or project laterally at least on one side in order to have more exchange surface area to the environment. Of course, the base body 2A may also project beyond the casing 22 on a plurality of sides.

Figure 5:
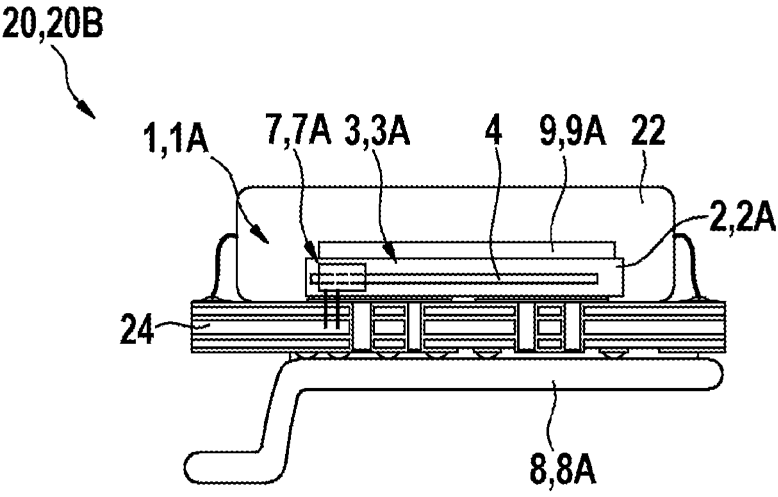
FIG. 5 shows a schematic representation of a second exemplary embodiment of a microelectric system with the temperature-control arrangement according to the present invention of FIGS. 1 to 3.

As can further be seen in FIG. 5, the base body 2A in the second exemplary embodiment shown of the microelectric system 20B is thermally coupled directly to a bottom side of the at least one object 9 to be temperature-controlled. In an exemplary embodiment not shown, in order to compensate for unevenness, a thermally conductive interface material can be introduced between the base body 2A and the bottom side of the at least one object 9 to be temperature-controlled. In the exemplary embodiment shown, the base body 2A shown of the temperature-control arrangement 1A is arranged on a multilayer circuit carrier 24 and is thermally coupled by way of thermally conductive through-connections to a top side of a heat exchanger 8 designed as a cooling element 8A. In addition, the temperature-control arrangement 1A and the at least one object 9 to be temperature-controlled are surrounded by a common casing 22. In this case, the base body 2A can be arranged completely within the casing 22 as shown or project laterally at least on one side in order to have more exchange surface area to the environment. Of course, the base body 2A may also project beyond the casing 22 on a plurality of sides.

Figure 6:
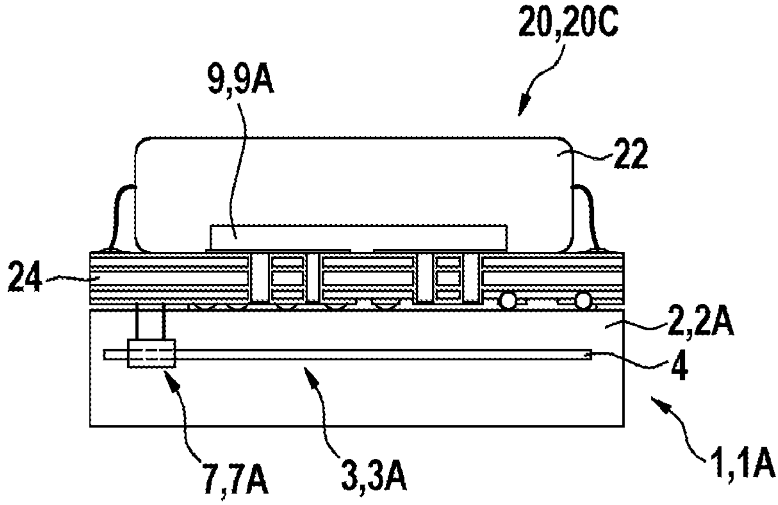
FIG. 6 shows a schematic representation of a third exemplary embodiment of a microelectric system with the temperature-control arrangement according to the present invention of FIGS. 1 to 3.

As can further be seen in FIG. 6, the base body 2A in the third exemplary embodiment shown of the microelectric system 20C is arranged on a bottom side of a multilayer circuit carrier 24. The object 9 to be temperature-controlled is arranged on a top side of the multilayer circuit carrier 24 and surrounded by a casing 22. The base body 2A is thermally coupled by way of thermally conductive through-connections to a bottom side of the at least one object 9 to be temperature-controlled.

In an exemplary embodiment not shown, the base body 2 can be integrated as an inner layer into a multilayer circuit carrier 24. In this case, the heat can be quickly guided into the edge layers and dissipated there, for example into a clamping edge of a housing, as a result of which the objects 9 to be temperature-controlled do not have to be arranged near the clamping edge.

In a further exemplary embodiment not shown, the base body 2 is shaped like a heat pipe, wherein longer distances between a heat source and a heat sink can be realized in comparison to a traditional heat pipe. In this case, the base body can be designed in portions in terms of the material selection such that it is flexible or deformable. The outer shape may, for example, be rectangular so that flat surfaces of the "active" heat pipe can be thermally contacted on flat heat dissipation surfaces of the at least one object 9 to be temperature-controlled.

Figure 7:
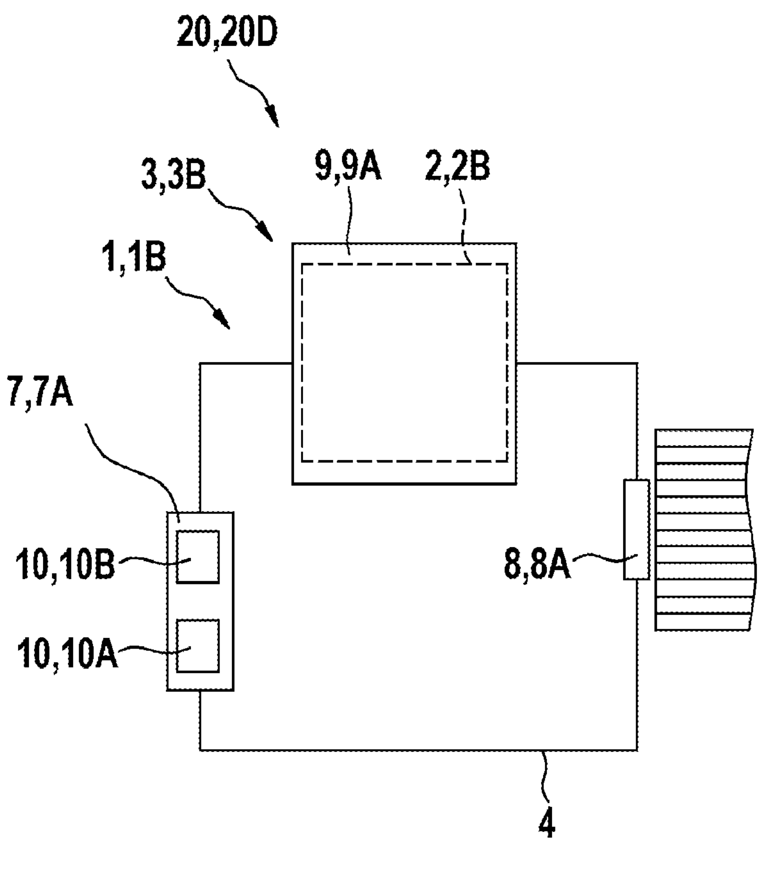
FIG. 7 shows a schematic representation of a second exemplary embodiment of a temperature-control arrangement according to the present invention for a microelectric system.

As can further be seen in FIG. 7, analogously to the first exemplary embodiment, the second exemplary embodiment shown of the temperature-control arrangement 1B comprises a magnetohydrodynamic pump 7A with two pump modules 10A, 10B, which are arranged fluidically in series one behind the other in a common channel 4 of the closed channel system 3B. As can further be seen in FIG. 7, the temperature-control arrangement 1B shown comprises a base body 2B in which only a portion of the at least one cooling channel 4 is arranged. The portion of the cooling channel 4 that is arranged in the base body 2B is designed as a substantially wider cavity. The electrically and thermally conductive medium 5 is conducted through this cavity in the base body 2B in order to make surface cooling of an object 9 to be temperature-controlled which is arranged on the base body 2B and designed as a semiconductor chip 9A possible. The two pump modules 10A, 10B arranged fluidically in series are arranged one behind the other upstream of the object 9 to be temperature-controlled or the base body 2B. Between the object 9 to be temperature-controlled or the base body 2B and the magnetohydrodynamic pump 7A is arranged a heat exchanger 8 arranged as a cooling element 8A, through which the electrically and thermally conductive medium 5 flows.

Figure 8:
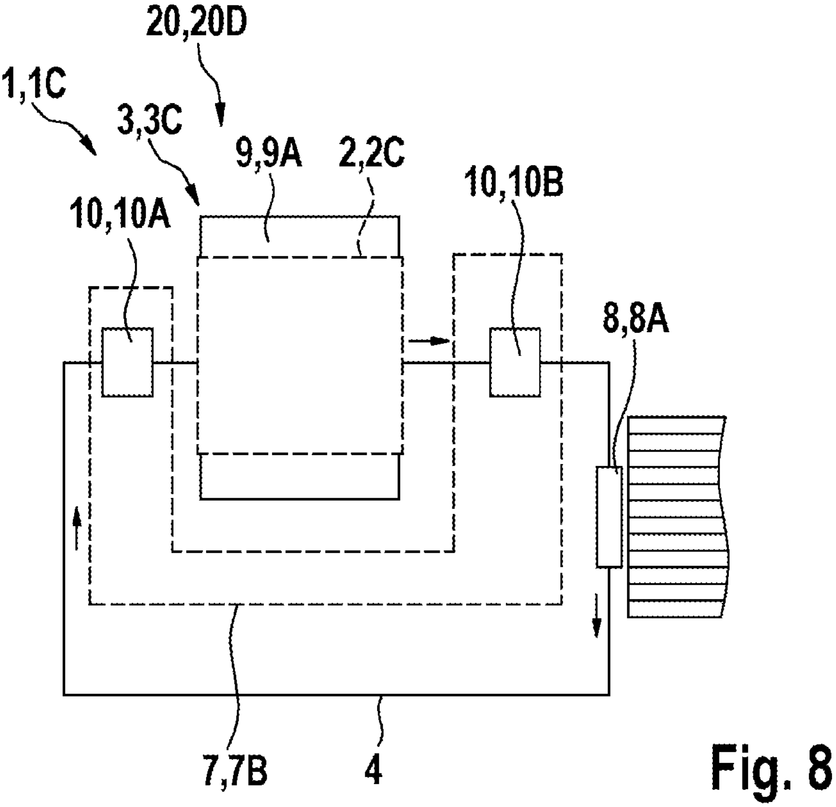
FIG. 8 shows a schematic representation of a third exemplary embodiment of a temperature-control arrangement according to the present invention for a microelectric system.

As can further be seen in FIG. 8, the third exemplary embodiment shown of the temperature-control arrangement 1C comprises a magnetohydrodynamic pump 7B with at least two pump modules 10A, 10B arranged fluidically in series and arranged separately from one another. In this case, at least one first pump module 10A is arranged upstream and at least one second pump module 10B is arranged downstream of the at least one object 9 to be temperature-controlled. As can further be seen in FIG. 8, the temperature-control arrangement 1C shown comprises a base body 2C, in which only a portion of the at least one cooling channel 4 is arranged. The portion of the cooling channel 4 that is arranged in the base body 2C is designed as a substantially wider cavity, into which additional pins have been introduced perpendicularly to the flow direction of the electrically and thermally conductive medium 5. The electrically and thermally conductive medium 5 is conducted through this cavity in the base body 2C in order to make surface cooling of an object 9 to be temperature-controlled which is arranged on the base body 2C and designed as a semiconductor chip 9A possible. The additional pins in the cavity improve the surface distribution of the electrically and thermally conductive medium 5 in the cavity. Between the at least one second pump module 10B and the at least one first pump module 10A is arranged a heat exchanger 8 arranged as a cooling element 8A, through which the electrically and thermally conductive medium 5 flows.

Figure 9:
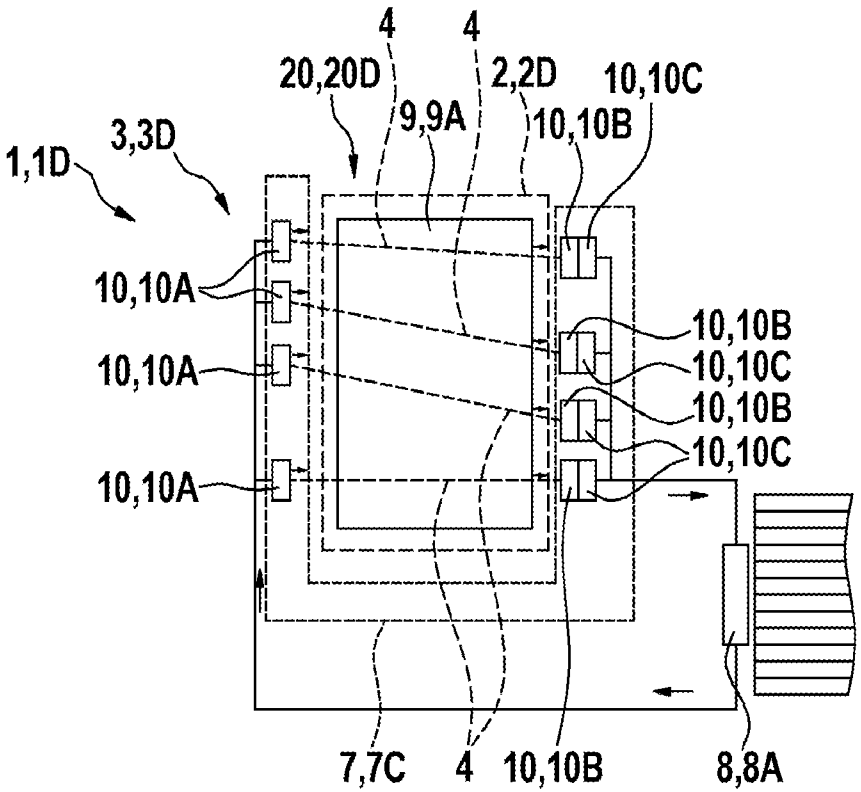
FIG. 9 shows a schematic representation of a fourth exemplary embodiment of a temperature-control arrangement according to the present invention for a microelectric system.

As can further be seen in FIG. 9, the fourth exemplary embodiment shown of the temperature-control arrangement 1D comprises a channel system 3D with a plurality of channels 4, which are arranged fluidically in parallel and have a common intake and a common drain, as well as a magnetohydrodynamic pump 7C with at least two pump modules 10A, 10B, which are arranged fluidically in parallel in at least two parallel channels 4. In the exemplary embodiment shown, four parallel channels 4 are arranged in a common base body 2D. As can further be seen in FIG. 9, at least two pump modules 10A, 10B arranged fluidically in series are arranged separately from one another in each of the channels 4 arranged fluidically in parallel. In this case, in the individual channels 4, at least one first pump module 10A is arranged upstream and at least one second pump module 10B is arranged downstream of the at least one object 9 to be temperature-controlled. As can further be seen in FIG. 9, the temperature-control arrangement 1D shown comprises an additional magnetohydrodynamic module 10, which is designed as sensor module 10C, in each of the four parallel channels. In such a sensor module 10C, at the at least one channel portion 4A, 4B, the electrodes 12A, 12B of the electrode device 12 tap an induction voltage, which results from the volume flow of the electrically and thermally conductive medium 5 in cooperation with the generated magnetic field B of the magnet device 14 and from which a flow velocity of the electrically and thermally conductive medium 5 can be ascertained. The sensor module also comprises a temperature sensor (not shown in detail) in order to ascertain the temperature of the electrically and thermally conductive medium 5 in the corresponding channel 4. Through the fluidic parallel connection of the at least two pump modules 10A, 10B in conjunction with the temperature measurement described above, the temperature-control arrangement 1D shown makes it possible to realize an individual volume flow in the individual parallel channels 4 in order, for example, to avoid hot spots on the object 9 to be temperature-controlled, or to cool in a very targeted manner high-loss regions of the object 9 to be temperature-controlled, or to ensure a uniform temperature or a targeted temperature distribution. Between the common drain and the common intake of the fluidically parallel channels 4 is arranged a heat exchanger 8 arranged as a cooling element 8A, through which the electrically and thermally conductive medium 5 flows. In the fourth exemplary embodiment shown of the temperature-control arrangement 1D, a plurality of first pump modules 10A can be arranged upstream of the object 9 to be temperature-controlled and a plurality of second pump modules 10B can be arranged downstream of the object 9 to be temperature-controlled.

In a further exemplary embodiment (not shown) of the temperature-control arrangement 1, the magnetohydrodynamic modules 10 arranged downstream of the object 9 to be temperature-controlled are designed to be switchable. The switchable magnetohydrodynamic modules 10 are operated in a first operating mode as a second pump module 10B and in a second operating mode as a sensor module 10C.

Embodiments of the temperature-control arrangement according to the present invention can be scaled as desired. This means that structure sizes less than 1 mm are possible. This relates in particular to the thickness of the base body and also to the channel diameters, which may also be only a few μm. There are also no technical limits for the size of the temperature-control arrangement. This relates in particular to a surface to be temperature-controlled, which can be attached to embodiments of the temperature-control arrangement according to the present invention. Due to the very good scalability, thermal energy in an amount of a few milliwatts up to megawatts can be dissipated by embodiments of the temperature-control arrangement according to the present invention. With embodiments of the temperature-control arrangement according to the present invention, it is possible to cool objects to be temperature-controlled to slightly below the boiling temperature of the electrically and thermally conductive medium used. When using the liquid metal alloy made of gallium, indium and tin, the boiling temperature is 1300° C. This is significantly more than the allowable temperature of pure water, water-glycol mixtures, or typical cooling media in conventional air conditioning compressors.

The invention claimed is:

1. A temperature-control arrangement for a microelectric system, comprising:

a closed channel system, which includes at least one channel for guiding an electrically and thermally conductive medium and is thermally coupled to at least one object of the microelectric system to be temperature-controlled; and a magnetohydrodynamic pump with a plurality of magnetohydrodynamic modules, each of the magnetohydrodynamic modules including an electrode device with two electrodes and a magnet device which generates a magnetic field, wherein at least two of the magnetohydrodynamic modules are configured as pump modules and are electrically connected in series, wherein, in each of the pump modules, a first electrode of the electrode device introduces an electric current flow with a specified current density at at least one channel portion into the electrically and thermally conductive medium and a second electrode of the electrode device conducts the electric current flow at the at least one channel portion out of the electrically and thermally conductive medium so that cooperation of the electrically and thermally conductive medium, guided in the closed channel system, with the introduced electric current flow and with the generated magnetic field generates a Lorentz force, which in a targeted manner accelerates the electrically and thermally conductive medium in the at least one channel portion, and a resulting pressure build-up brings about a desired volume flow of the electrically and thermally conductive medium through the at least one channel of the closed channel system, wherein the volume flow of the electrically and thermally conductive medium brings about a temperature control of the at least one object to be temperature-controlled, wherein the electrically and thermally conductive medium transfers heat to the at least one object to be temperature-controlled during a heating process or absorbs heat from the at least one object to be temperature-controlled during a cooling process.

2. The temperature-control arrangement according to claim 1, wherein the closed channel system is thermally coupled to at least one heat exchanger, which is configured as a heating element for the heating process or as a cooling element for the cooling process.

3. The temperature-control arrangement according to claim 1, wherein the closed channel system is at least partially arranged in a thermally conducting base body, which is thermally coupled to the at least one object to be temperature-controlled.

4. The temperature-control arrangement according to claim 3, wherein the base body completely accommodates the closed channel system and the magnetohydrodynamic pump.

5. The temperature-control arrangement according to claim 3, wherein the base body is thermally coupled directly or by way of a thermally conductive interface material to a top side or a bottom side of the at least one object to be temperature-controlled.

6. The temperature-control arrangement according to claim 3, wherein the base body is thermally coupled by way of at least one thermally conductive through-connection to a top side or a bottom side of the at least one object to be temperature-controlled.

7. The temperature-control arrangement according to claim 3, wherein the at least one channel is surrounded at least within the base body by an electrical insulation.

8. The temperature-control arrangement according to claim 1, wherein at least one of the magnetohydrodynamic modules is a sensor module, in which, at the at least one channel portion, the electrodes of the electrode device tap an induction voltage, which results from the volume flow of the electrically and thermally conductive medium in cooperation with the generated magnetic field of the magnet device and from which a flow velocity of the electrically and thermally conductive medium can be ascertained.

9. The temperature-control arrangement according to claim 1, wherein at least one of the magnetohydrodynamic modules is configured to be switchable and can be operated in a first operating mode as a pump module and in a second operating mode as a sensor module.

10. The temperature-control arrangement according to claim 1, wherein at least two of the pump modules are arranged fluidically in series one behind the other in a common channel.

11. The temperature-control arrangement according to claim 10, wherein the at least two of the pump modules arranged fluidically in series are arranged one behind the other upstream or downstream of the at least one object to be temperature-controlled.

12. The temperature-control arrangement according to claim 10, wherein the at least two of the pump modules arranged fluidically in series are arranged separately from one another, wherein at least one first pump module of the at least two of the pump modules is arranged upstream and at least one second pump module of the at least two of the pump modules is arranged downstream of the at least one object to be temperature-controlled.

13. The temperature-control arrangement according to claim 1, wherein at least two of the pump modules are arranged fluidically in parallel in at least two parallel channels.

14. The temperature-control arrangement according to claim 13, wherein the at least two of the magnetohydrodynamic modules are arranged fluidically in series one behind the other in at least one of the at least two parallel channels.

15. The temperature-control arrangement according to claim 1, wherein the at least one magnet device includes at least two permanent magnets or at least one electrical coil device.

16. A microelectric system, comprising:

at least one object to be temperature-controlled; and at least one temperature-control arrangement, including:

a closed channel system, which includes at least one channel for guiding an electrically and thermally conductive medium and is thermally coupled to the at least one object of the microelectric system to be temperature-controlled, and a magnetohydrodynamic pump with a plurality of magnetohydrodynamic modules, each of the magnetohydrodynamic modules including an electrode device with two electrodes and a magnet device which generates a magnetic field, wherein at least two of the magnetohydrodynamic modules are configured as pump modules and are electrically connected in series, wherein, in each of the pump modules, a first electrode of the electrode device introduces an electric current flow with a specified current density at at least one channel portion into the electrically and thermally conductive medium and a second electrode of the electrode device conducts the electric current flow at the at least one channel portion out of the electrically and thermally conductive medium so that cooperation of the electrically and thermally conductive medium, guided in the closed channel system, with the introduced electric current flow and with the generated magnetic field generates a Lorentz force, which in a targeted manner accelerates the electrically and thermally conductive medium in the at least one channel portion, and a resulting pressure build-up brings about a desired volume flow of the electrically and thermally conductive medium through the at least one channel of the closed channel system, wherein the volume flow of the electrically and thermally conductive medium brings about a temperature control of the at least one object to be temperature-controlled, wherein the electrically and thermally conductive medium transfers heat to the at least one object to be temperature-controlled during a heating process or absorbs heat from the at least one object to be temperature-controlled during a cooling process.

17. The microelectric system according to claim 16, wherein the at least one temperature-control arrangement and the at least one object to be temperature-controlled are surrounded by a common casing.

* * * * *